United States Patent
Hsu et al.

(10) Patent No.: US 7,470,946 B2
(45) Date of Patent: Dec. 30, 2008

(54) TRIPLE-JUNCTION FILTERLESS CMOS COLOR IMAGER CELL

(75) Inventors: Sheng Teng Hsu, Camas, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 139 days.

(21) Appl. No.: 11/580,407

(22) Filed: Oct. 13, 2006

(65) Prior Publication Data
US 2007/0218580 A1 Sep. 20, 2007

Related U.S. Application Data

(63) Continuation-in-part of application No. 11/499,081, filed on Aug. 4, 2006, now Pat. No. 7,233,036, which is a continuation-in-part of application No. 11/416,742, filed on May 3, 2006, which is a continuation-in-part of application No. 11/384,110, filed on Mar. 17, 2006, now Pat. No. 7,419,844.

(51) Int. Cl.
*H01L 31/062* (2006.01)
*H01L 31/113* (2006.01)

(52) U.S. Cl. .......................... 257/292; 257/290; 438/48
(58) Field of Classification Search ................. 257/290, 257/292, 293, 294; 438/48
See application file for complete search history.

(56) References Cited

U.S. PATENT DOCUMENTS

| | | | | |
|---|---|---|---|---|
| 5,016,108 A * | 5/1991 | Akimoto et al. | ............. | 348/302 |
| 6,476,372 B2 | 11/2002 | Merrill et al. | ............. | 250/208.1 |
| 6,960,757 B2 | 11/2005 | Merrill et al. | ................ | 250/226 |
| 7,189,951 B2 * | 3/2007 | Sakurai | .................... | 250/208.1 |
| 2007/0034884 A1 * | 2/2007 | McKee | ........................ | 257/89 |

OTHER PUBLICATIONS

K. M. Findlater, D. Renshaw, J. E. D. Hurwitz, R. K. Henderson, M. D. Purcell, S. G. Smith, and T. E. R. Bailey, "A CMOS Image Sensor With a Double-Junction Active Pixel". IEEE Trans. Ed 50, #1, pp. 32-42, Jan. 2003.

K.M.Findlatera, P.B.Denyerb, R.K.Hendersonb, J.E.D.Hurwitzb, J.M.Raynorb, D.Renshawa, "Buried double junction pixel using green and magenta filters", pp. 60-64, 1999.

* cited by examiner

*Primary Examiner*—Phuc T Dang
(74) *Attorney, Agent, or Firm*—Law Office of Gerald Maliszewski; Gerald Maliszewski

(57) ABSTRACT

A triple-junction complimentary metal-oxide-semiconductor (CMOS) filterless color imager cell is provided. The imager cell is made from a bulk silicon (Si) substrate. A photodiode set including a first, second, and third photodiode are formed as a triple-junction structure in the Si substrate. A transistor set is connected to the photodiode set, and detects an independent output signal for each photodiode. Typically, the transistor set is formed in the top surface of the substrate. For example, the Si substrate may be a p-doped Si substrate, and the photodiode triple-junction structure includes the first photodiode forming a pn junction from an n+-doped region at the Si substrate top surface, to an underlying p-doped region. The second photodiode forms a pn junction from the p-doped region to an underlying n-well, and the third photodiode forms a pn junction from the n-well to the underlying p-doped Si substrate.

7 Claims, 12 Drawing Sheets

$T_B$: TRANSFER TRANSISTOR FOR BLUE COLOR SENSING DIODE
$T_G$: TRANSFER TRANSISTOR FOR GREEN COLOR SENSING DIODE
$T_R$: TRANSFER TRANSISTOR FOR RED COLOR SENSING DIODE

R: RED COLOR SENSING DIODE
G: GREEN COLOR SENSING DIODE
B: BLUE COLOR SENSING DIODE

TRIPLE-JUNCTION FILTERLESS CMOS COLOR IMAGER CELL

RELATED APPLICATIONS

This application is a Continuation-in-Part of a patent application entitled, DOUBLE-JUNCTION FILTERLESS CMOS COLOR IMAGER CELL, invented by Hsu et al., Ser. No. 11/499,081, filed Aug. 4, 2006 now U.S. Pat. No. 7,233,036, which is a Continuation-in-Part of a pending patent application entitled, WIDE OUTPUT SWING CMOS IMAGER, invented by Lee et al., Ser. No. 11/416,742, filed May 3, 2006, which is a Continuation-in-Part of a patent application entitled, A REAL-TIME CMOS IMAGER HAVING STACKED PHOTODIODES FABRICATED ON SOI WAFER, invented by Lee et at., Ser. No. 11/384,110, filed Mar. 17, 2006 now U.S. Pat. No. 7,419,844. All three of the above-mentioned applications are incorporated herein by reference.

BACKGROUND OF THE INVENTION

1. Field of the Invention

This invention generally relates to complementary metal/oxide/semiconductor (CMOS) imaging sensors and, more particularly, to an imager pixel transistor set for reading signals from triple-junction photodiodes formed in a bulk silicon substrate.

2. Description of the Related Art

Figure 1:
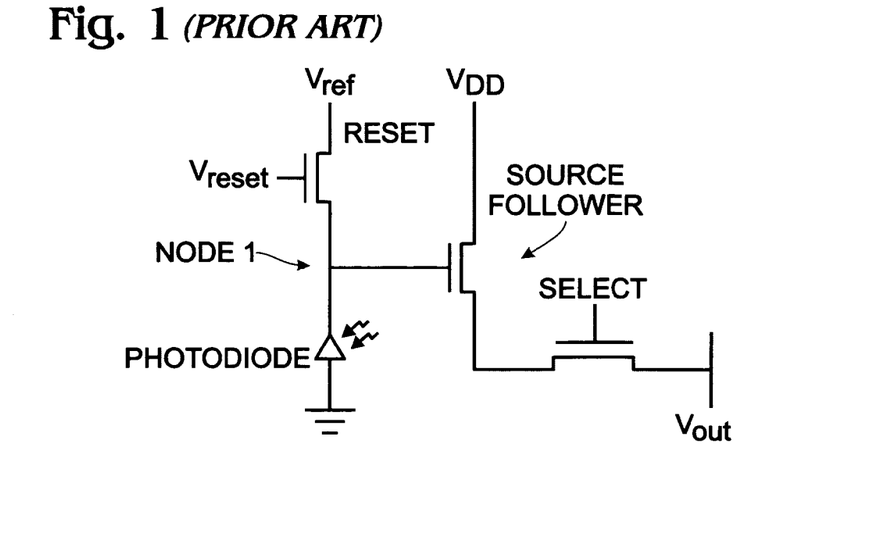
FIG. 1 is a schematic diagram depicting an active pixel sensor (APS) imager cell made with n-channel MOS (NMOS) transistors (prior art).

FIG. 1 is a schematic diagram depicting an active pixel sensor (APS) imager cell made with n-channel MOS (NMOS) transistors (prior art). The APS cell includes a reset transistor, source follower transistor, select transistor, and a photodiode. All three transistors in the APS cell are NMOS. The drain and source terminals of the reset transistor are respectively coupled to a reference supply ($V_{Ref}$) and a cathode (node 1) of photodiode, whose anode is coupled to a ground or fixed reference voltage ($V_{SS}$). The source terminal of reset transistor drives the gate terminal of source follower transistor, whose drain and source terminals are coupled, respectively, to a power supply ($V_{DD}$) and drain terminal of the select transistor. The reference supply ($V_{Ref}$) may be, but need not be, equal to the power supply ($V_{DD}$). During operation, a high reset voltage ($V_{Reset}$) is initially provided at the reset transistor to pull node 1 up to a dark reference voltage ($V_{Dark}$). If the active reset voltage is high enough to keep reset transistor in the linear region, the dark reference voltage $V_{Dark}$ equals $V_{Ref}$. When the reset voltage is turned off, the charge trapped at photodiode cathode (i.e., node 1) maintains a high voltage there. When the APS cell is exposed to light, the photodiode discharges node 1, to bring the voltage at node 1 towards the ground reference voltage. The voltage at node 1 can be read by turning on the select transistor, which is done by applying a selection voltage to the gate terminal of the select transistor, and sensing the output voltage $V_{Out}$. For an undischarged pixel, voltage $V_{Out}$ is given by:

$$V_{out} = V_{Dark} - V_{noise} - V_{TN}$$

where $V_{Dark}$ is the dark reference voltage at node 1, $V_{noise}$ represents a reset noise, and $V_{TN}$ is the threshold voltage for source follower transistor.

Figure 2A:
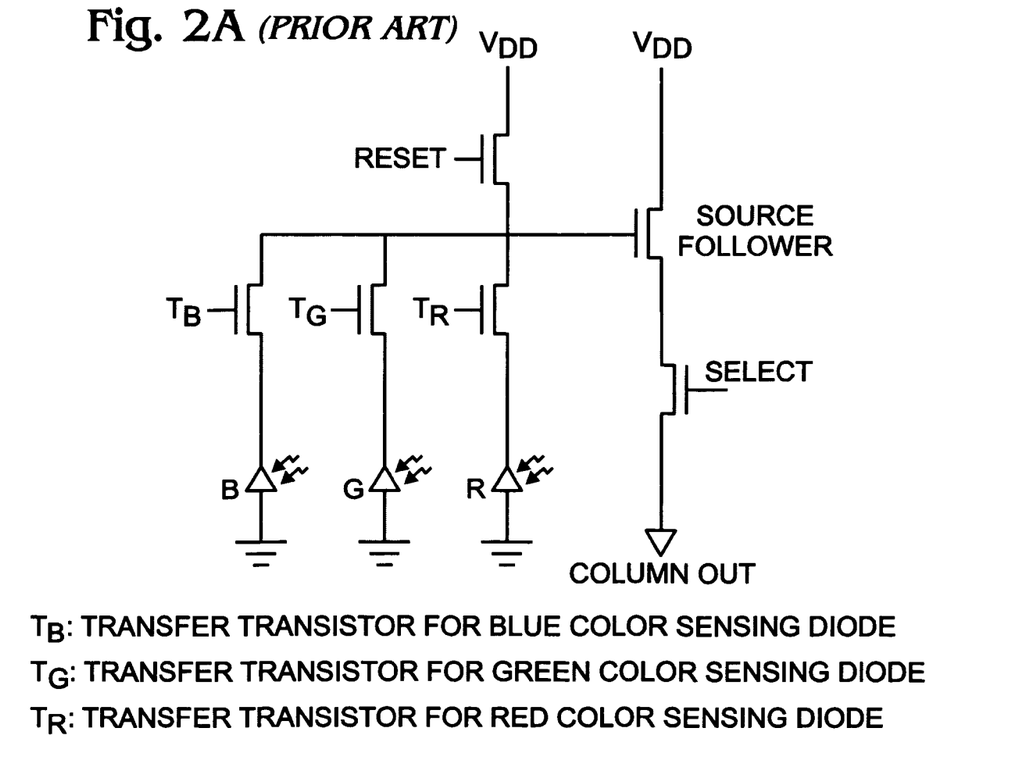
FIG. 2A is a schematic diagram depicting a bulk silicon (Si) six-transistor (6T) stacked junction imager cell (prior art).

FIG. 2A is a schematic diagram depicting a bulk silicon (Si) six-transistor (6T) stacked junction imager cell (prior art). The 6T cell includes the 3T cell of FIG. 1, plus additional transfer transistors.

Figure 2B:
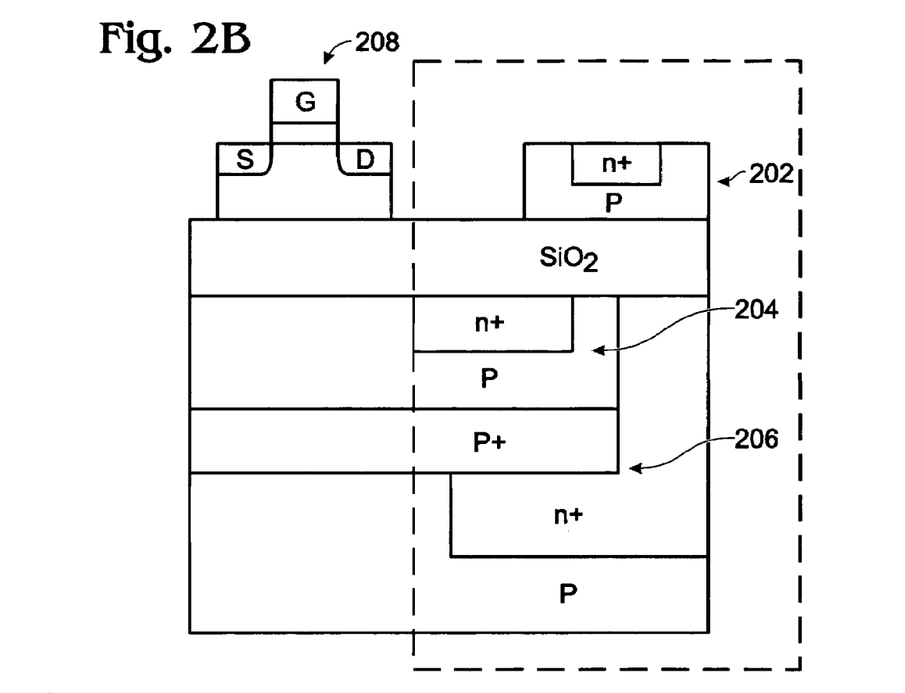
FIG. 2B is a partial cross-sectional view of a stacked set of photodiodes formed in a Si-on-insulator (SOI) substrate (prior art).

FIG. 2B is a partial cross-sectional view of a stacked set of photodiodes formed in a Si-on-insulator (SOI) substrate (prior art). The photodiode set 200 includes three stacked photodiodes 202, 204, and 206. Note, none of the photodiodes share a junction. That is, the p-doped and n-doped areas of the three diodes are distinct and separate. The photodiode set is controlled by a transistor set, such as the set shown in FIG. 2A or FIG. 3, which is represented in this figure by transistor 208.

Figure 3:
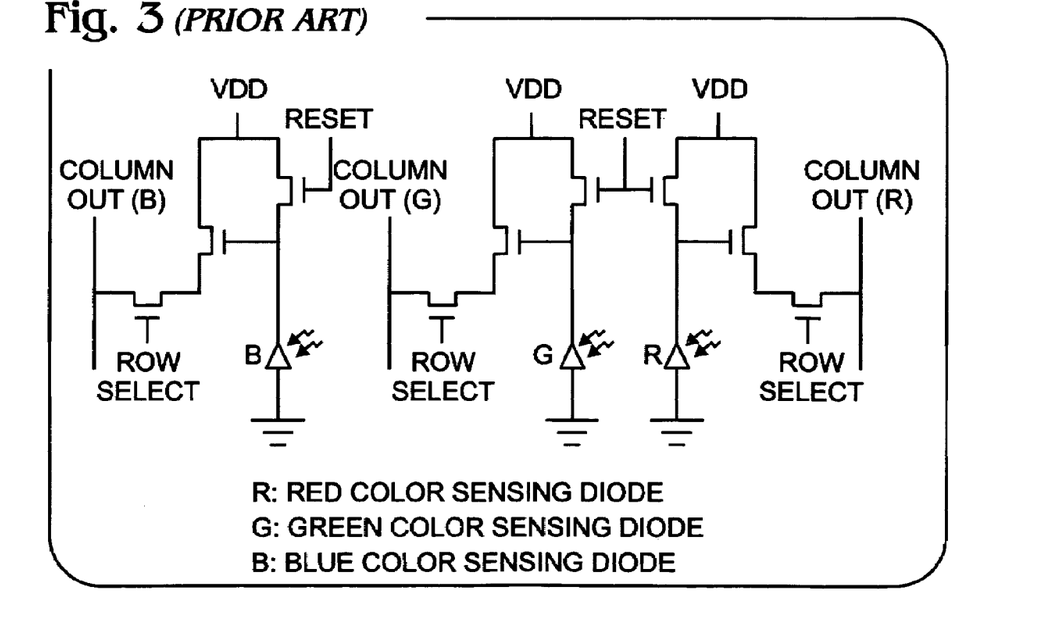
FIG. 3 is a schematic diagram depicting a bulk Si nine-transistor (9T) stacked junction imager cell (prior art).

FIG. 3 is a schematic diagram depicting a bulk Si nine-transistor (9T) stacked junction imager cell (prior art). The 9T cell includes three of the 3T cells of FIG. 1. Stacked photo-detectors are used for color imaging, one diode for each of the red (R), green (G), and blue (B) colors. A stacked RGB photodiode can directly measure red, green, and blue signals by efficiently stacking three photodiodes on top of one another using a triple-well CMOS process wherein the blue, green, and red sensitive pn junctions are disposed at different depths beneath the surface of a semiconductor substrate upon which the imager is formed (see FIG. 2B). This technology increases the sampling density, improves sharpness, and eliminates the color aliasing artifacts. Further, this technology does not require color filters.

Figure 4A:
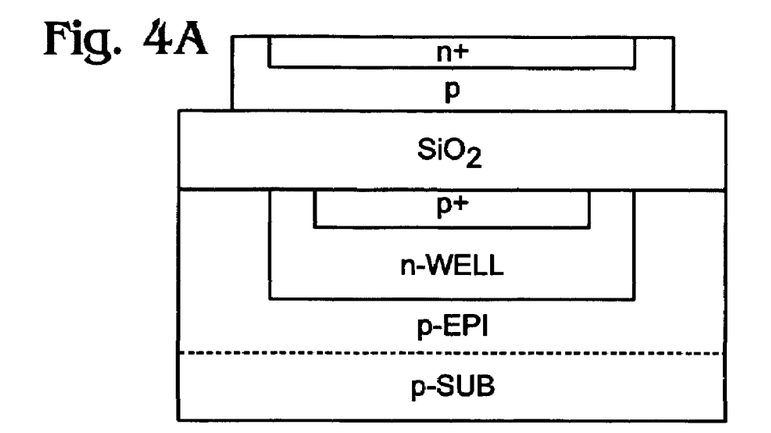
FIGS. 4A and 4B depict a silicon-on-insulator (SOI) version of a multi-junction filterless color imager (prior art).
Figure 4B:
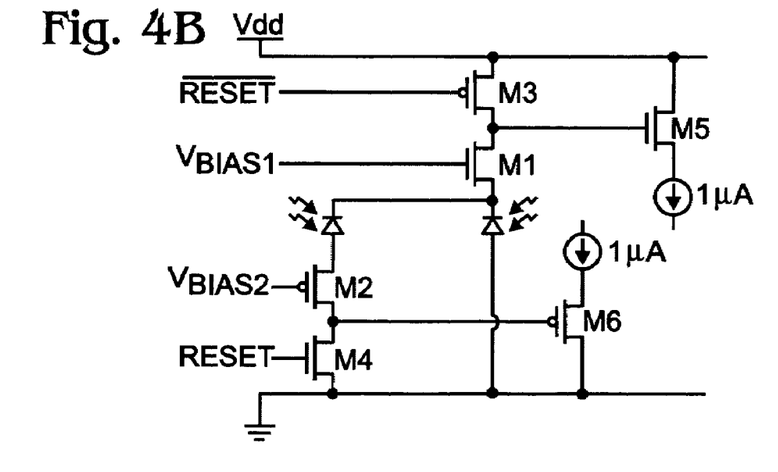

FIGS. 4A and 4B depict a silicon-on-insulator (SOI) version of a multi-junction filterless color imager (prior art). The blue diode D1 is fabricated at SOI top silicon film. The green diode is the P+N diode and the red diode are the N–P-substrate diode. The structure is very simple. The APS circuit is shown in FIG. 4B where the red diode output is read at M5. The source follower, M6, reads a differential signal responsive to both the red and green photodiode. There is no direct green diode read out capability. The blue diode is fabricated SOI top Si layer and the APS circuit of the blue diode is a conventional unit as is shown in FIG. 1.

Figure 18A:
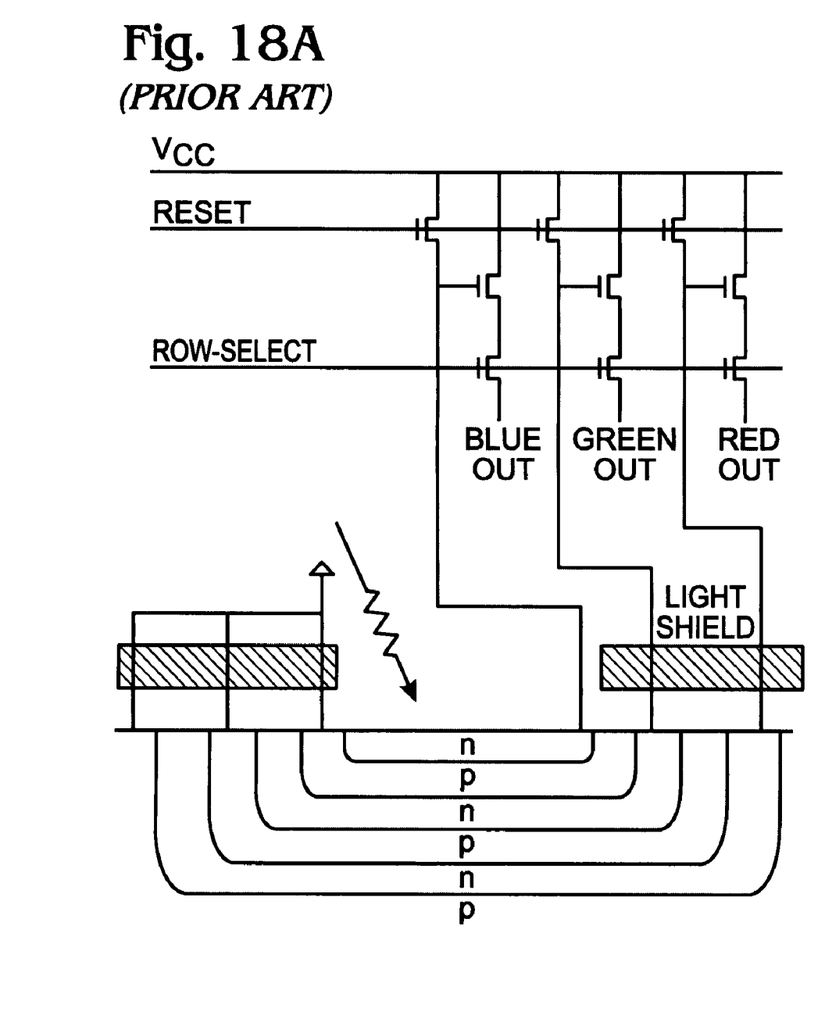
FIGS. 18A and 18B are drawings depicting a five-junction photodiode imager and corresponding transistor set for reading the diode signals (prior art).
Figure 18B:
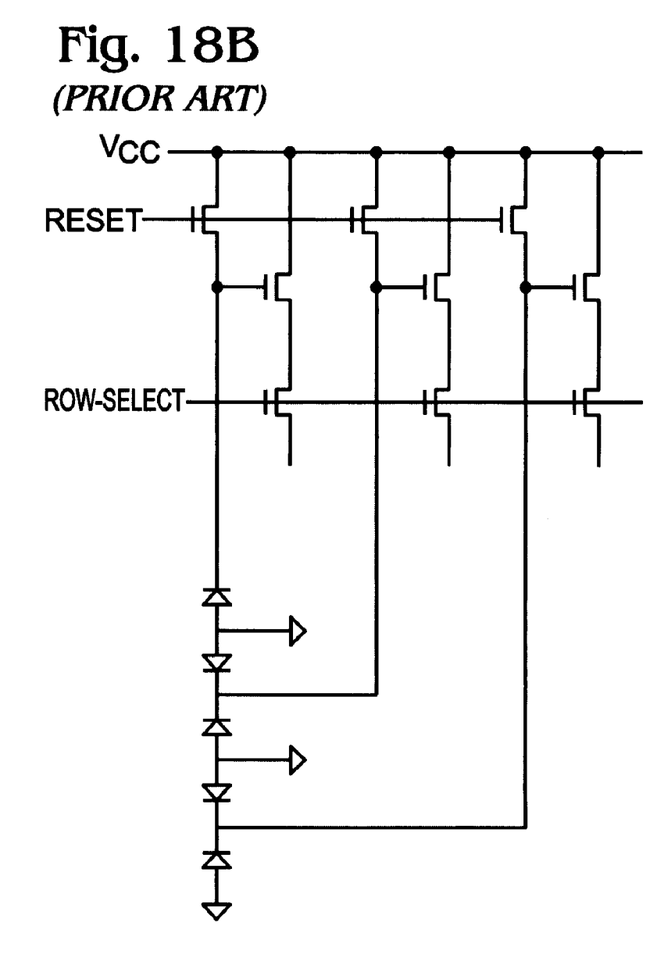

FIGS. 18A and 18B are drawings depicting a five-junction photodiode imager and corresponding transistor set for reading the diode signals (prior art). In U.S. Pat. Nos. 6,476,372 and 6,960,757, Merrill et al. disclose a filterless color CMOS imager cell having an n1/p1/n2/p2/n3/p-substrate structure. The pixel consists of five (5) junctions. All the p-type layers are grounded. The n1/p1 interface forms a junction for blue diode. The green diode is formed by the parallel combination of the n2/p1 and n2/p2 junctions. The red diode is formed by the parallel combination of the n3/p2 and n3-p-substrate junctions. Since n2/p1 and n2/p2 diodes have a common cathode and the anodes are all grounded, the voltage of the n2/p1 junction is equal to that of the voltage of the n2/p2 junction. Similarly, the voltage of the n3/p2 junction is equal to that of n3/p-substrate. Therefore, the photovoltaic voltage of green diode is about the average of the photovoltaic voltage for the n2/p1 and n2/p2 junctions, but it is not the sum of the n2/p1 and n2/p2 junctions. Two photodiodes in parallel do not generate two times the photovoltaic voltage.

The photon absorption spectra are mainly dependant upon the depth of silicon. The number of electron-hole pairs generated by incident light increases with the width of the depletion layer. The depth of the junctions for each diode color is very much fixed. As a result, the width of the depletion regions of the red and green diode junctions is much narrower than that of photodiode with a single depletion layer. The green diode and the red diode output voltages are much smaller than that of a single diode, since the width of each of the two diodes cannot be made larger than a single depletion width in any given junction depth. In addition, the area of each junction has to be properly increased with the depth of the junction in order to avoid shorting between adjacent junctions at the surface. As a result, the solar cell pixel filling factor decreases and the pixel size increases.

Some of the above-mentioned problems can be addressed using a silicon-on-insulator (SOI) structure. Although the SOI structure is able to reduce the number of junctions required, increase the filling factor, and reduce the pixel size, the wafer bonding process is not a common process in a conventional CMOS wafer fabrication facility.

Therefore, it is desirable to have a filterless triple-junction CMOS color imager that is fabricated in bulk silicon, without using a SOI process.

It would be advantageous if the triple-junction photodiode imager could be enabled with an imager sensing transistor set to independently read the output of each photodiode.

SUMMARY

The present invention describes a filterless triple-junction bulk substrate CMOS color imager with separate blue, green, and red output active pixel sensor circuit signals. There are three (3) junctions in each pixel cell. In one aspect, the layers are N+/P/N-well/p-substrate. Each photodiode is formed with one junction. The N+/P junction is blue diode. The P/N-well is green diode, and the N-well/P-substrate junction is the red diode. Therefore, the active photon detection area can be much larger than in previous designs. In addition, the area of the imager pixel can be made much smaller. The active pixel sensing circuit independently reads each individual blue, green, and red diode photovoltaic voltage.

In another related aspect, a filterless multiple junction bulk CMOS color imager is presented with four (4) junctions. The layers are P+/N/P/N-well/P-substrate. The first P+/N junction is blue diode. The N/P junction is the green diode, and the P/N-well junction is the red diode. The doping density of each layer is selected so that the depletion region of the junction is as wide as possible, without completely depleting any layer during reset operations. The red diode is isolated from the p-type substrate. The adjacent diodes are isolated by a single neutral conductive layer.

Accordingly, a triple-junction complimentary metal-oxide-semiconductor (CMOS) filterless color imager cell is provided. The imager cell is made from a bulk silicon (Si) substrate with a top surface. A photodiode set including a first, second, and third photodiode are formed as a triple-junction structure in the Si substrate. A transistor set is connected to the photodiode set, and detects an independent output signal for each photodiode. Typically, the transistor set is formed in the top surface of the substrate.

For example, the Si substrate may be a p-doped Si substrate, and the photodiode triple-junction structure includes the first photodiode forming a pn junction from an n+-doped region at the Si substrate top surface, to an underlying p-doped region. The second photodiode forms a pn junction from the p-doped region to an underlying n-well, and the third photodiode forms a pn junction from the n-well to the underlying p-doped Si substrate.

Alternately, the Si substrate is a p-doped Si substrate and the photodiode triple-junction structure includes four diffusion layers. The first photodiode forms a pn junction from a first p+-doped region at the Si substrate top surface, to an underlying n-doped region. The second photodiode forms a pn junction from the n-doped region to an underlying second p-doped region, and the third photodiode forms a pn junction from the second p-doped region to the underlying n-doped well (n-well), which overlies the p-doped Si substrate.

Also provided are three and four diffusion layer designs formed in an n-doped substrate. Further, examples of transistor sets are provided for use with the above-mentioned photodiodes that permit the diode signals to be read independently from each other. Also, methods are provided below for independently detecting signals from a triple junction complimentary CMOS color imager cell.

DETAILED DESCRIPTION

Figure 5:
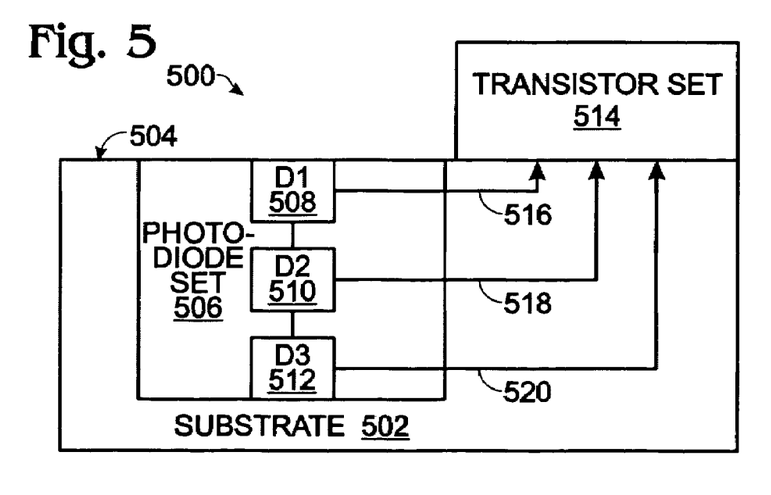
FIG. 5 is a schematic block diagram depicting a triple-junction complimentary metal-oxide-semiconductor (CMOS) filterless color imager cell.

FIG. 5 is a schematic block diagram depicting a triple-junction complimentary metal-oxide-semiconductor (CMOS) filterless color imager cell. The imager cell 500 comprises a bulk silicon (Si) substrate 502 with a top surface 504. A photodiode set 506, including a first photodiode (D1) 508, second photodiode (D2) 510, and third photodiode (D3) 512, is formed as a triple-junction structure in the Si substrate

502. A transistor set 514 is connected to the photodiode set 506, for detecting an independent output signal for each photodiode.

More specifically, the transistor set 514 detects an output signal on line 516 for the first photodiode 508, but not the second diode 510 and third photodiode 512, at a first time. The transistor set 514 detects an output signal on line 518 for the second photodiode 510, but not the first diode 508 and third photodiode 512, at a second time. The second time is a different time than the first time. Likewise, the transistor set 514 detects an output signal on line 520 for the third photodiode 512, but not the first diode 508 and second photodiode 510, at a third time, different than the first and second times.

Figure 6:
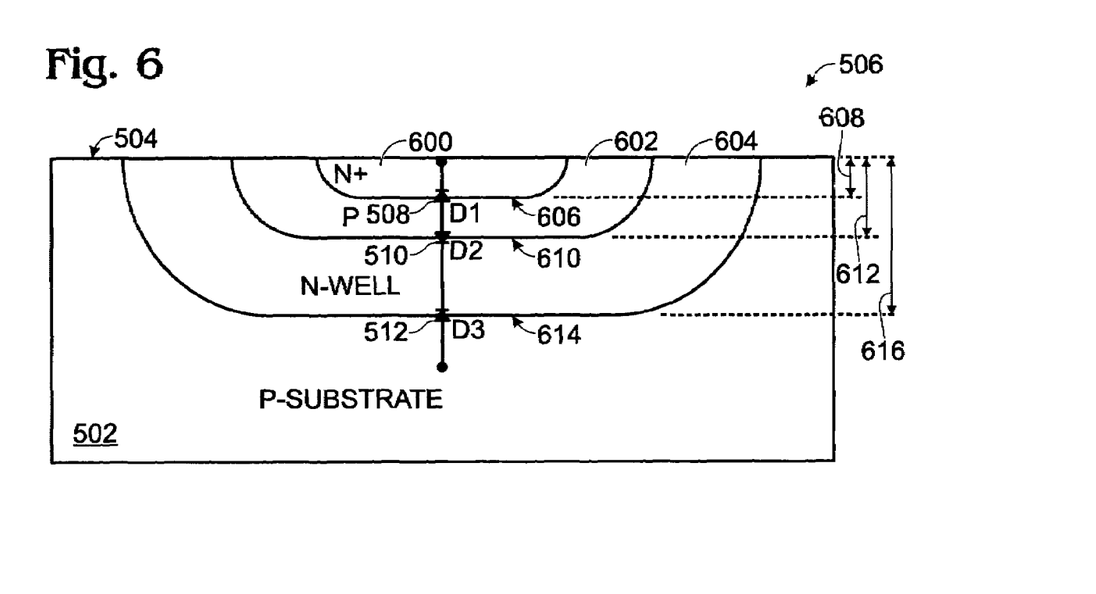
FIG. 6 is a partial cross-sectional view of a first variation of the photodiode set of FIG. 5.

FIG. 6 is a partial cross-sectional view of a first variation of the photodiode set 506 of FIG. 5. The Si substrate 502 is a p-doped Si substrate. The photodiode triple-junction structure includes the first photodiode (D1) 508 forming a pn junction from an n+-doped region 600 at the Si substrate top surface 504, to an underlying p-doped region 602. The second photodiode (D2) 510 forms a pn junction from the p-doped region 602 to an underlying n-well 604. The third photodiode (D3) 512 forms a pn junction from the n-well 604 to the underlying p-doped Si substrate 502.

The first photodiode pn junction 606 has a depth 608 of about 0.1 to 0.4 micrometers (μm) beneath the Si substrate top surface 504. The second photodiode pn junction 610 has a depth 612 about 0.4 to 0.6 μm beneath the Si substrate top surface 504, and the third photodiode pn junction 614 has a depth 616 about 1.8 to 2.2 μm beneath the Si substrate top surface 504.

Figure 7:
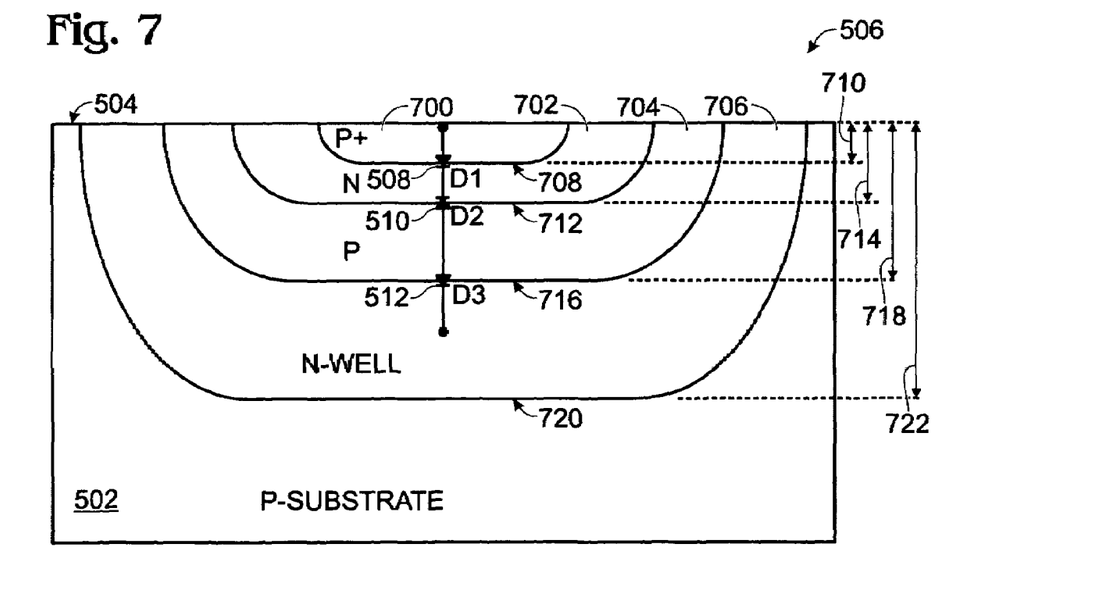
FIG. 7 is a partial cross-sectional view of a second variation of the photodiode set of FIG. 5.

FIG. 7 is a partial cross-sectional view of a second variation of the photodiode set 506 of FIG. 5. Again, the Si substrate 502 is a p-doped Si substrate. The photodiode triple-junction structure includes four diffusion layers, as follows. The first photodiode 508 forms a pn junction from a first p+-doped region 700 at the Si substrate top surface 504, to an underlying n-doped region 702. The second photodiode 510 forms a pn junction from the n-doped region 702 to an underlying second p-doped region 704. The third photodiode 512 forms a pn junction from the second p-doped region 704 to the underlying n-doped well (n-well) 706, which overlies the p-doped Si substrate 502.

The first photodiode pn junction 708 has a depth 710 of about 0.1 to 0.4 micrometers (μm) beneath the Si substrate top surface 504. The second photodiode pn junction 712 has a depth 714 about 0.4 to 0.6 μm beneath the Si substrate top surface 504. The third photodiode pn junction 716 has a depth 718 about 1.8 to 2.2 μm beneath the Si substrate top surface 504, and the interface 720 between the n-well 706 and the underlying p-doped substrate 502 has a depth 722 about 3.5 to 6 μm beneath the Si substrate top surface 504.

Figure 8:
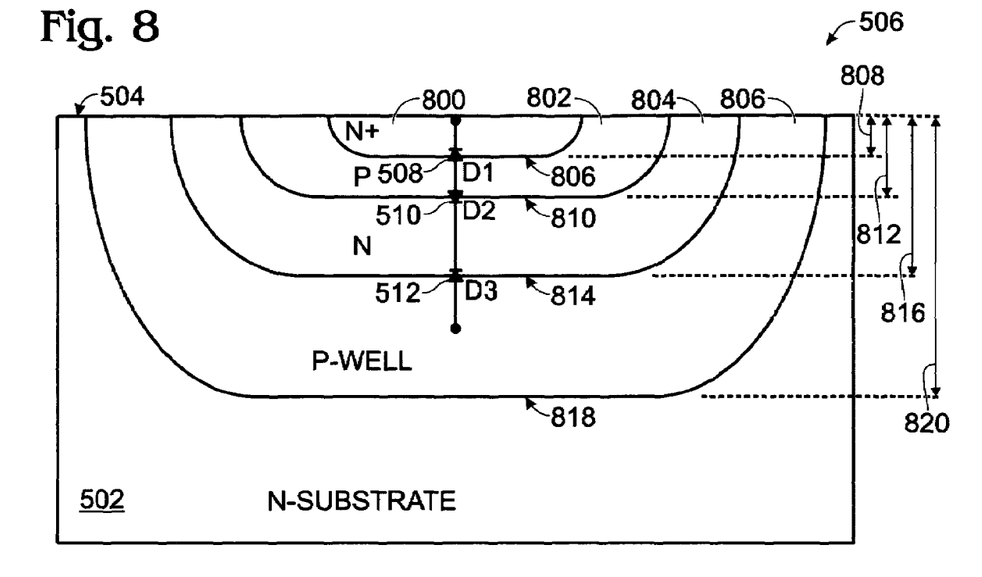
FIG. 8 is a partial cross-sectional view of a third variation of the photodiode set of FIG. 5.

FIG. 8 is a partial cross-sectional view of a third variation of the photodiode set 506 of FIG. 5. In this aspect the Si substrate 502 is an n-doped Si substrate. The photodiode triple-junction structure includes four diffusion layers, as follows. The first photodiode 508 forms a pn junction from a first n+-doped region 800 at the Si substrate top surface 504, to an underlying p-doped region 802. The second photodiode 510 forms a pn junction from the p-doped region 802 to an underlying second n-doped region 804. The third photodiode 512 forms a pn junction from the second n-doped region 804 to the underlying p-doped well (p-well) 806, which overlies the n-doped Si substrate 502.

The first photodiode pn junction 806 has a depth 808 of about 0.1 to 0.4 micrometers (μm) beneath the Si substrate top surface 504. The second photodiode pn junction 810 has a depth 812 about 0.4 to 0.6 μm beneath the Si substrate top surface 504. The third photodiode pn junction 814 has a depth 816 about 1.8 to 2.2 μm beneath the Si substrate top surface 504, and the interface 818 between the p-well 806 and the underlying n-doped substrate 502 has a depth 820 of about 3.5 to 6 μm beneath the Si substrate top surface 504.

Figure 9:
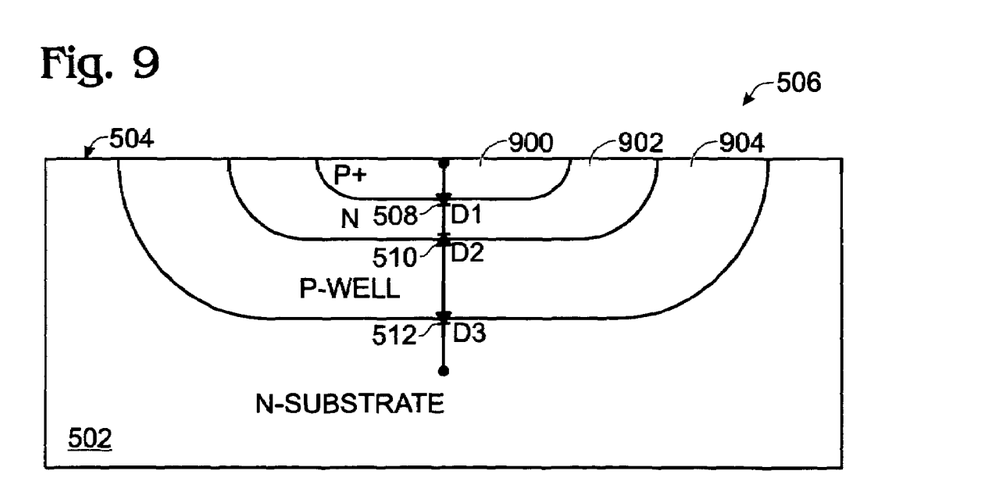
FIG. 9 is a partial cross-sectional view of a fourth variation of the photodiode set of FIG. 5.

FIG. 9 is a partial cross-sectional view of a fourth variation of the photodiode set 506 of FIG. 5. The Si substrate 502 is an n-doped Si substrate. The photodiode triple junction structure includes the first photodiode 508 forming a pn junction to a p-doped (p+) region 900 at the Si substrate top surface 504, from an underlying n-doped region 902. The second photodiode 510 forms a pn junction to the n-doped region 902 from an underlying p-well 904. The third photodiode 512 forms a pn junction from the p-well 904 to the underlying n-doped Si substrate 502.

Figure 10:
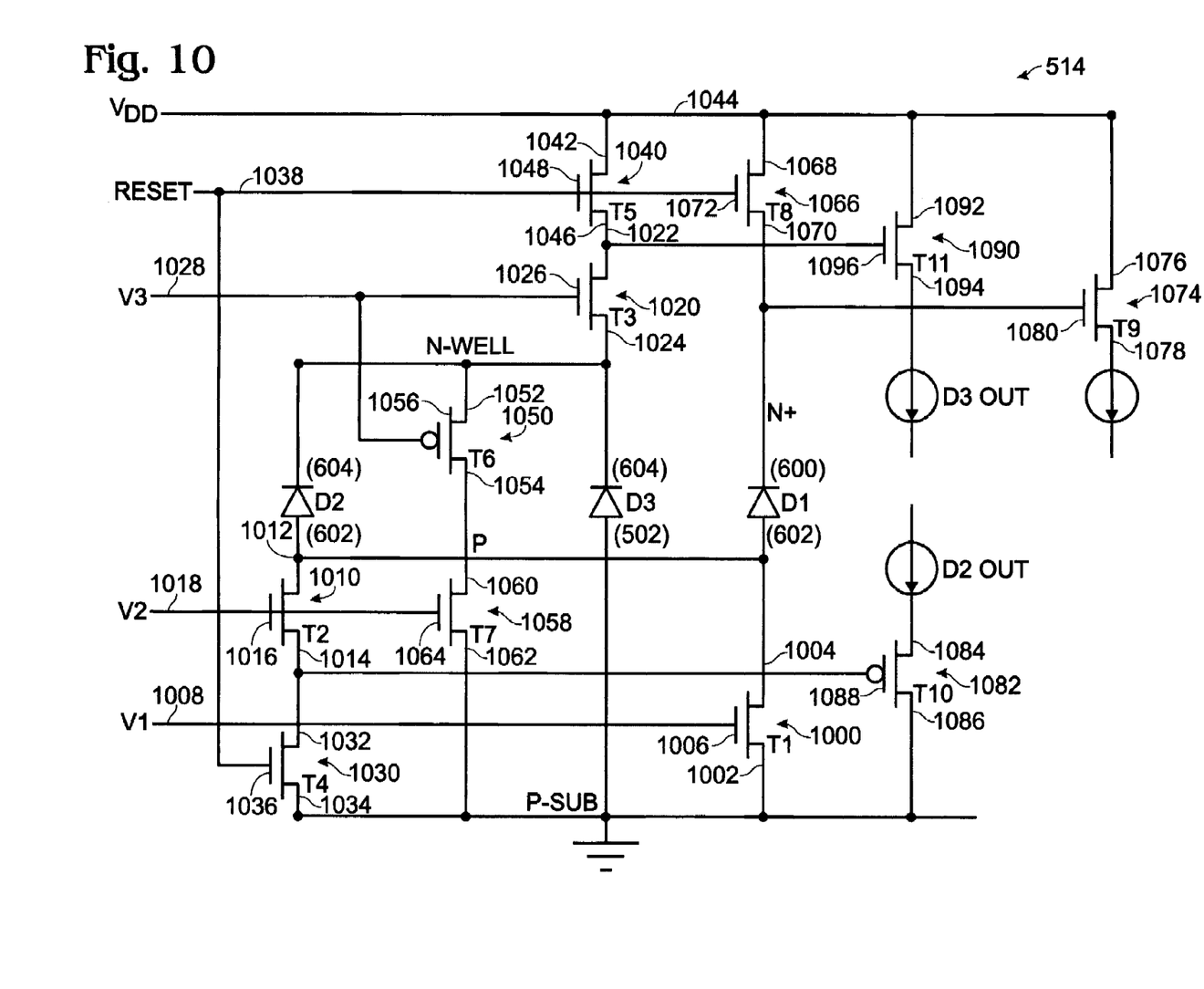
FIG. 10 is a schematic diagram depicting a transistor set enabled as an 11T (transistor) cell, for use with the photodiode set of FIG. 6.

FIG. 10 is a schematic diagram depicting a transistor set enabled as an 11T (transistor) cell, for use with the photodiode set of FIG. 6. The transistor set 514 includes a first (NMOS) transistor (T1) 1000 with a first source/drain (S/D) region 1002, a second S/D region 1004 connected to the p-doped region 602, and a gate 1006 connected to a first select line (V1) 1008. A second (NMOS) transistor (T2) 1010 has a first S/D region 1012 connected to the p-doped region 602, a second S/D region 1014, and a gate 1016 connected to a second select line (V2) 1018. A third (NMOS) transistor (T3) 1020 has a first S/D region 1022, a second S/D region 1024 connected to the n-well 604, and a gate 1026 connected to a third select line (V3) 1028.

A fourth (NMOS) transistor (T4) 1030 has a first S/D region 1032 connected to the T2 second S/D region 1014, a second S/D region 1034 connected to the p-doped Si substrate 502, and a gate 1036 connected to a reset line 1038. A fifth (NMOS) transistor (T5) 1040 has a first S/D region 1042 connected to a supply voltage (Vdd) 1044, a second S/D region 1046 connected to the T3 first S/D 1022, and a gate 1048 connected to the reset line 1038.

A sixth (PMOS) transistor (T6) 1050 has a first S/D region 1052 connected to the n-well 604, a second S/D region 1054, and a gate 1056 connected to the third select line (V3) 1028. A seventh (NMOS) transistor (T7) 1058 has a first S/D region 1060 connected to the T6 second S/D region 1054, a second S/D region 1062 connected to the p-doped Si substrate 502, and a gate 1064 connected to the second select line (V2) 1018.

An eighth (NMOS) transistor (T8) 1066 has a first S/D region 1068 connected to the supply voltage (Vdd) 1044, a second S/D region 1070 connected to the n+-doped region 600, and a gate 1072 connected to the reset line 1038. A ninth (NMOS) transistor (T9) 1074 has a first S/D region 1076 connected to the supply voltage (Vdd) 1044, and second S/D region 1078 to supply the first photodiode output signal, and a gate 1080 connected to n-doped region 600.

A tenth (PMOS) transistor (T10) 1082 has a first S/D region 1084 connected to supply the second photodiode output signal, a second S/D region 1086 connected to the p-doped Si substrate 502, and a gate 1088 connected to the second S/D region of T2 1014. An eleventh (NMOS) transistor (T11) 1090 has a first S/D region 1092 connected to the supply voltage (Vdd) 1044, a second S/D region 1094 to supply the third photodiode output signal, and a gate 1096 connected to the T3 first S/D region 1022.

Figure 11:
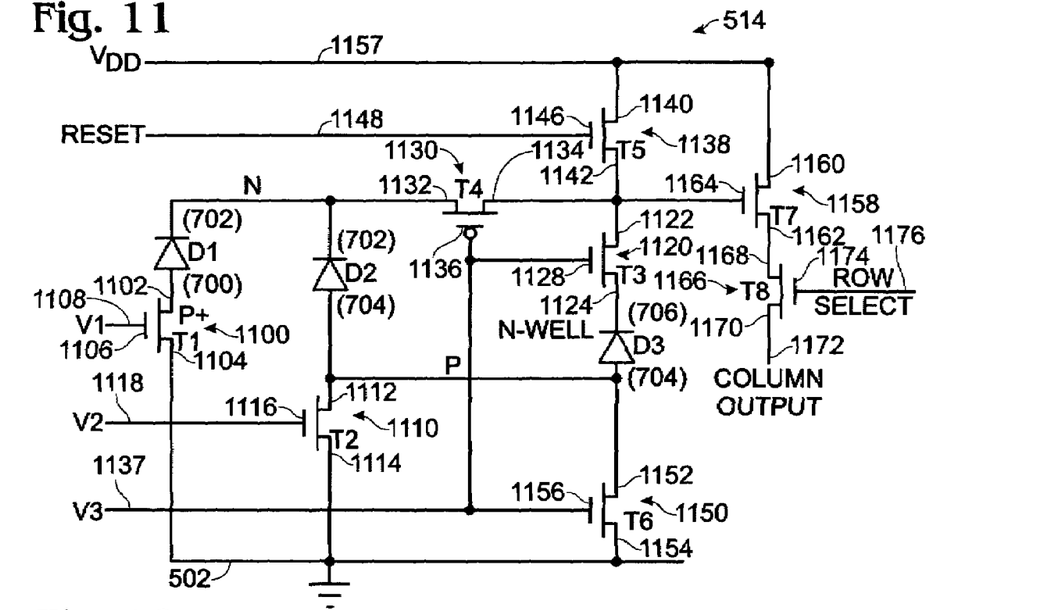
FIG. 11 is a schematic diagram depicting a transistor set enabled as an 8T cell, for use with the photodiode set of FIG. 7.

FIG. 11 is a schematic diagram depicting a transistor set enabled as an 8T cell, for use with the photodiode set of FIG. 7. A first (NMOS) transistor (T1) 1100 has a first source/drain (S/D) region 1102 connected to the first p+-doped region 700, a second S/D region 1104 connected to (the same voltage potential as) the p-doped Si substrate 502, and a gate 1106 connected to a first select line (V1) 1108. A second (NMOS)

transistor (T2) 1110 has a first S/D region 1112 connected to the second p-doped region 704, a second S/D region 1114 connected to the p-doped Si substrate 502, and a gate 1116 connected to a second select line (V2) 1118.

A third (NMOS) transistor (T3) 1120 has a first S/D region 1122, a second S/D region 1124 connected to the n-well 706, and a gate 1126 connected to a third select line (V3) 1128. A fourth (PMOS) transistor (T4) 1130 has a first S/D region 1132 connected to the n-doped region 702, a second S/D region 1134 connected to the T3 first S/D region 1122, and a gate 1136 connected to the third select line (V3) 1137. A fifth (NMOS) transistor (T5) 1138 has a first S/D region 1140 connected to a supply voltage (Vdd) 1142, a second S/D region 1144 connected to the T3 first S/D region 1122, and a gate 1146 connected to a reset line 1148.

A sixth (NMOS) transistor (T6) 1150 has a first S/D region 1152 connected to the second p-doped region 704, a second S/D region 1154 connected to the p-doped Si substrate 502, and a gate 1156 connected to the third select line (V3) 1157. A seventh (NMOS) transistor (T7) 1158 has a first S/D region 1160 connected to the supply voltage 1142, a second S/D region 1162, and a gate 1164 connected to the T3 first S/D region 1122. An eighth (NMOS) transistor (T8) 1166 has a first S/D region 1168 connected to the T7 second S/D region 1162, a second S/D region 1170 connected to supply a photodiode output signal. Depending on the selection signal, explained in detail below, signals from the first, second, or third photodiodes may be independently sensed on the column output line 1172. A gate 1174 is connected to a row select input on line 1176. Typically, the imager is part of an array (not shown) where individual transistor sets are enabled using the row select signal.

Figure 12:
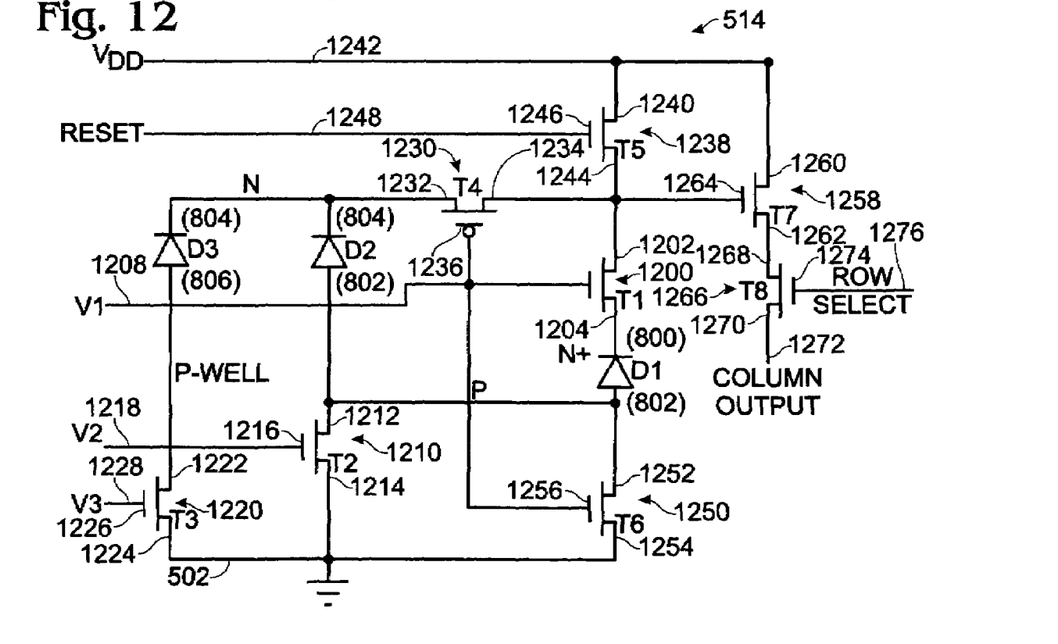
FIG. 12 is a schematic diagram depicting a transistor set enabled as an 8T cell, for use with the photodiode set of FIG. 8.

FIG. 12 is a schematic diagram depicting a transistor set enabled as an 8T cell, for use with the photodiode set of FIG. 8. A first (NMOS) transistor (T1) 1200 has a first source/drain (S/D) region 1202, a second S/D region 1204 connected to the first n+-doped region 800, and a gate 1206 connected to a first select line (V1) 1208. A second (NMOS) transistor (T2) 1210 has a first S/D region 1212 connected to the p-doped region 802, a second S/D region 1214 connected to the n-doped Si substrate 502, and a gate 1216 connected to a second select line (V2) 1218.

A third (NMOS) transistor (T3) 1220 has a first S/D region 1222, a second S/D region 1224 connected to the n-doped Si substrate 502, and a gate 1226 connected to a third select line (V3) 1228. A fourth (PMOS) transistor (T4) 1230 has a first S/D region 1232 connected to the second n-doped region 804, a second S/D region 1234 connected to the T1 first S/D region 1202, and a gate 1236 connected to the first select line (V1) 1208. A fifth (NMOS) transistor (T5) 1238 has a first S/D region 1240 connected to a supply voltage (Vdd) 1242, a second S/D region 1244 connected to the T1 first S/D region 1202, and a gate 1246 connected to a reset line 1248.

A sixth (NMOS) transistor (T6) 1250 has a first S/D region 1252 connected to the p-doped region 802, a second S/D region 1254 connected to the n-doped Si substrate 502, and a gate 1256 connected to the first select line (V1) 1208. A seventh (NMOS) transistor (T7) 1258 has a first S/D region 1260 connected to the supply voltage 1242, a second S/D region 1262, and a gate 1264 connected to the T1 first S/D region 1202. An eighth (NMOS) transistor (T8) 1266 has a first S/D region 1268 connected to the T7 second S/D region 1262, a second S/D region 1270 connected to supply a photodiode from one of the first, second, and third photodiodes on line 1272, and a gate 1274 connected to a row select input 1276.

Although a transistor set has not been explicitly depicted for the photodiode set of FIG. 9, the design of such a circuit could be derived by a person of skill in the art, based upon the above-described transistor set examples.

Functional Description

Returning to FIG. 6, a cross-sectional view of a triple bulk junction is shown. The substrate is a p-type silicon wafer. There are three diffusion layers which made up three photodiodes. The doping density of each layer is selected so that the depletion region of the junction is as wide as possible, without completely depleting any layer during reset operations. The N+/P junction is the first diode, and it is a blue diode. The P/N-well junction is the second diode, and it is a green diode. The N-well/P-substrate junction is the third (red) photodiode. The depth of the N+ layer is about 0.1 μm. The depth of the P-layer is about 0.4 to 0.6 μm. The depth of N-well is about 1.8 to 2.2 μm.

Referring again to FIG. 10, the equivalent circuit is shown for the active pixel sensor (APS) associated with the photodiode set of FIG. 6. While the blue diode is integrated with the triple-junction in the bulk silicon, electrically the blue diode is isolated from the green and the red diodes. The source followers T9, T10, and T11 are the output transistors for blue diode, green diode, and red diode, respectively. There are three reset transistor; T4, T5, and T8. Transistors T6 and T7 ground the cathode of the green diode during the green diode voltage sensing process. The operation of the APS is best described together with a pulse timing diagram.

Figure 13:
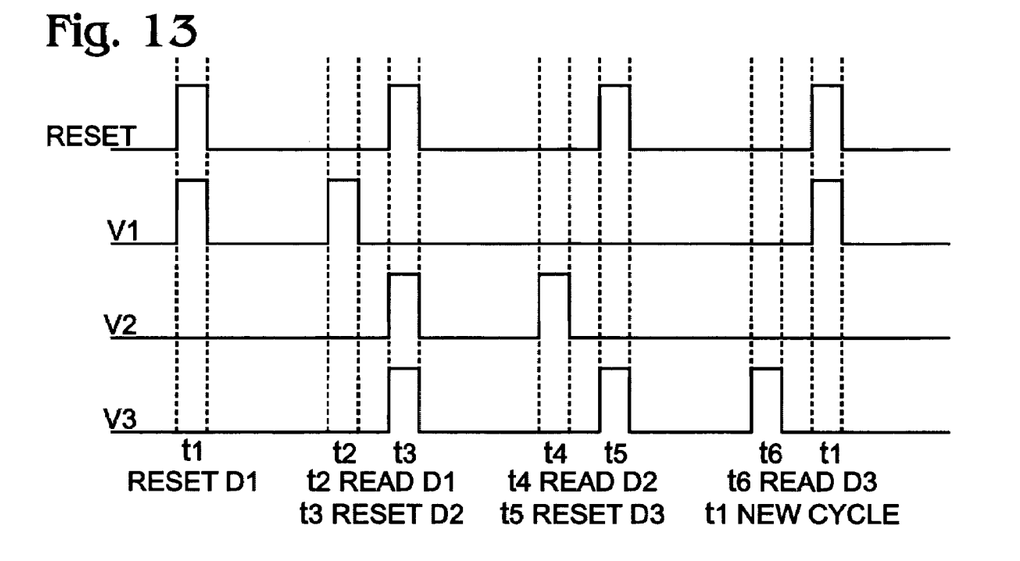
FIG. 13 is a timing diagram describing the operation of the transistor set of FIG. 10.

FIG. 13 is a timing diagram describing the operation of the transistor set of FIG. 10. During time t1, both reset and V1 are on, to reset D1. Transistors T2 and T3 are turned off. Diodes D2 and D3 are floated. D1 is reset to $V_{DD}$. When all pulses are turned off, all three photo diodes are floated. After t1, the photon dose at D1 is integrated. During t2, the blue diode (D1) is selected, which grounds the anode of D1. Reset, V2, and V3 are off. D2 and D3 are floated. The gate voltage of the source follower transistor T9 is equal to the blue diode voltage. The voltage of the blue diode D1 is transferred to the appropriate column. There is no signal from either D2 or D3.

During t3, Reset, V2, and V3 are all on. Transistor T6 is off, while transistor T7 in on. Both D2 and D3 are reset to $V_{DD}$. During t4, the green diode select voltage (V2) is on. V1, V3, and Reset are off. Transistors T6, T2, and T7 are turned on. The cathode of the D2 is grounded through transistors T6 and T7. Both D1 and D3 are floated. The voltage of D2 is read out through the source follower T10, and transferred to the appropriate column.

During t5, both the Reset and V3 pulses are on. The red diode D3 is reset to $V_{DD}$. Both diodes D1 and D2 are floated. During t6 only the red diode is selected. The transfer transistor T3 is on and the shunt transistors T6 and T7 are off. Both D1 and D2 are floated. The voltage of D3 is read to the gate of the source follower transistor T11, and is transferred to a given column. This completes one operation cycle. As shown, the blue diode, green diode, and the red diode can be reset and read through an independent source follower.

Returning to FIG. 7, a cross-sectional view of the triple junction is shown. The substrate is a p-type silicon wafer. There are four diffusion layers, which made up three photodiodes and an isolation junction from the substrate. The P+/N junction is the first (blue) diode. The N/P junction is the second (green) diode. The P/N-well junction is the third (red) photodiode. The red diode is isolated from the P-type silicon substrate. The depth of the P+ layer is about 0.1 μm, the depth of the N-layer is about 0.4 to 0.6 µm, the depth of P-layer is about 1.8 to 2.2 µm, and the depth of the N-well is about 3.5 to 6 µm.

Referring again to FIG. 11, the equivalent circuit is shown for the APS associated with the photodiode set of FIG. 7. T5 is the reset transistor, and T1 and T2 are the select transistors for the blue diode (D1) and green diode (D2), respectively. The red diode is selected with T3 and T6, with a PMOS (T4), to isolate D3 from D1 and D2. When the D3 select voltage (V3) is off, T4 is on and both T3 and T6 are off.

Figure 14:
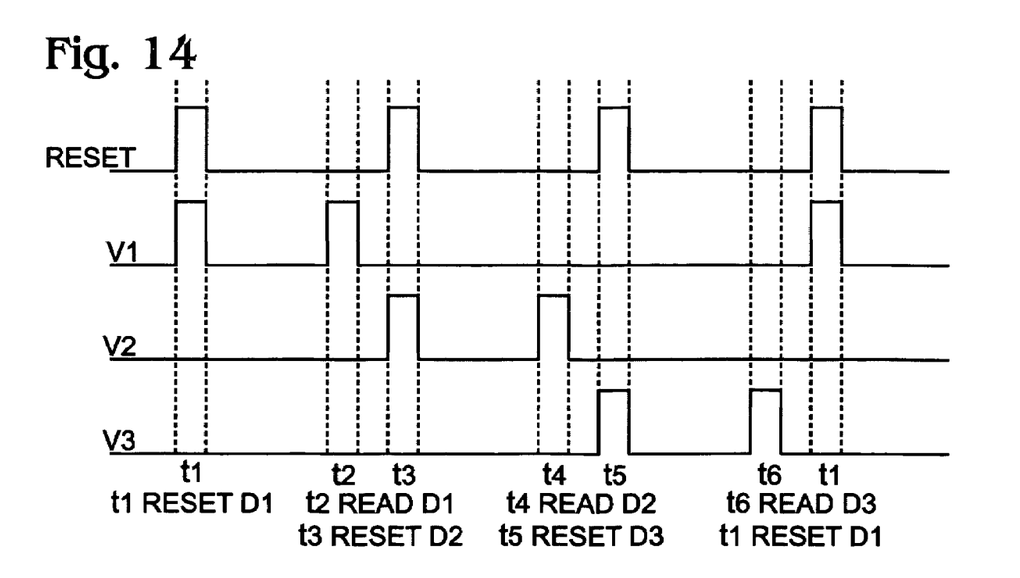
FIG. 14 is a timing diagram describing the operation of the transistor set of FIG. 11.

FIG. 14 is a timing diagram describing the operation of the transistor set of FIG. 11. During time t1, both Reset and the D1 are selected, and V1 is on. The transistors T2 and T3 are turned off. Diodes D2 and D3 are floated, and D1 is reset to $V_{DD}$. When all pulses are turned off, all the three photodiodes are floated. After t1, the photon dose at D1 is integrated. During t2, the blue diode (D1) is selected and the Reset pulse is off. The gate voltage of the source follower transistor (T7) is equal to the blue diode voltage. The row select pulse (see FIG. 11) is on. The voltage of diode D1 is transferred to the selected column. This same process applies to the reset, photon dose integration and readout of the green diode D2 during the time interval t3 through t4. During time interval t5, the Reset pulse and the D3 select pulse are turned on. Transistors T3, T5, and T6 are turned on, and the p-type transistor T4 is turned off. The red diode D3 is isolated from the blue diode (D1) and green diode (D2). The blue diode and green diode are floated. The red diode (D3) is reset to $V_{DD}$. After t5, the red diode integrates the photon dose. At time t6, the row select pulse and the red diode pulse are turned on. The voltage of the red diode (D3) is transferred to the selected column through the source follower T7. This completes the operation sequence.

The APS transistor set associated with FIG. 12 is similar to the transistor set of FIG. 11, and its operation need not be explained in detail. As described above, the photodiode set (see FIG. 8) associated with FIG. 12, is the same as that of FIG. 7, except that difference in doping requires that D1 be "exchanged" with D3. However, the three color diodes output are independent to each other, and the timing diagram for the n-type silicon substrate imager (FIG. 8) is the same as that of the p-type silicon substrate imager (FIG. 7).

Figure 15:
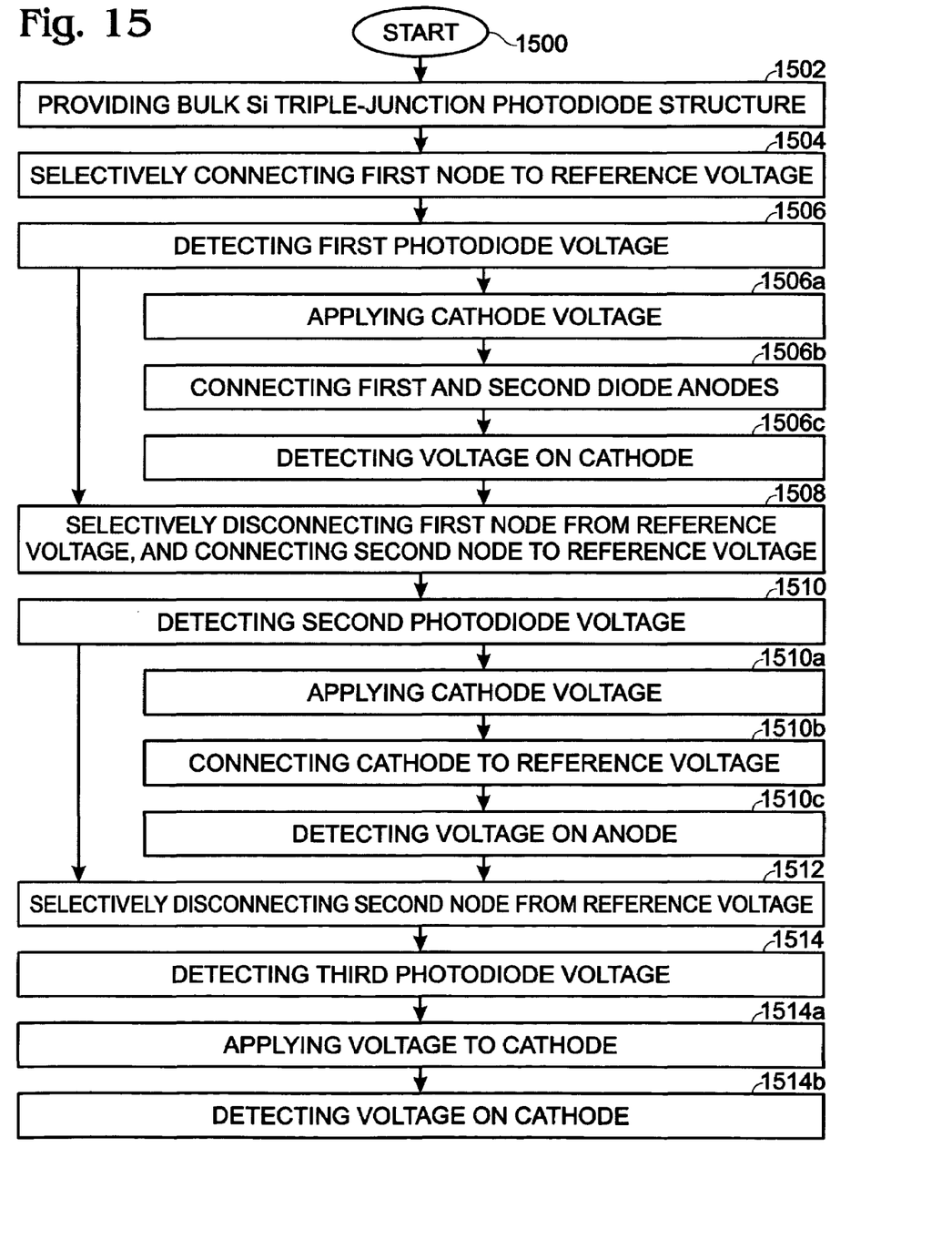
FIG. 15 is a flowchart illustrating a method for independently detecting signals from a triple-junction CMOS color imager cell.

FIG. 15 is a flowchart illustrating a method for independently detecting signals from a triple-junction CMOS color imager cell. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1500.

Step 1502 provides a bulk Si substrate with a triple-junction structure of first, second, and third photodiodes, where the first and second photodiodes share a first common node, and the second and third photodiodes share a second common node. Step 1504 selectively connects the first common node to a reference voltage. Step 1506 detects the first photodiode voltage. Step 1508 selectively disconnects the first common node from the reference voltage, and connects the second common node to the reference voltage. Step 1510 detects the second photodiode voltage. Step 1512 selectively disconnects the second common node from the reference voltage, and Step 1514 detects the third photodiode voltage. The method of FIG. 15 is associated with the circuits of FIGS. 6 and 10.

In one aspect, Step 1502 provides a triple-junction structure where the first and second photodiodes share a common anode, the second and third photodiodes share a common cathode, and an anode of the third photodiode is connected to the reference voltage. Then, Step 1504 connects the anodes of the first and second photodiodes to the reference voltage, and Step 1512 disconnects the cathodes of the second and third photodiodes from the reference voltage.

In another aspect, detecting the first photodiode voltage in Step 1506 includes substeps. Step 1506a applies a voltage to the first photodiode cathode. Step 1506b connects the first and second photodiode anodes to the reference voltage, and Step 1506c detects the voltage on the first photodiode cathode. Detecting the second photodiode voltage also includes substeps. Step 1510a applies a voltage to the second photodiode cathode. Step 1510b connects the second photodiode cathode to the reference voltage, and Step 1510c detects the voltage on the second photodiode anode. Detecting the third photodiode voltage includes the following substeps. Subsequent to disconnecting the second common node from the reference voltage, Step 1514a applies a voltage to the third photodiode cathode, and Step 1514b detects the voltage on the third photodiode cathode.

Figure 16:
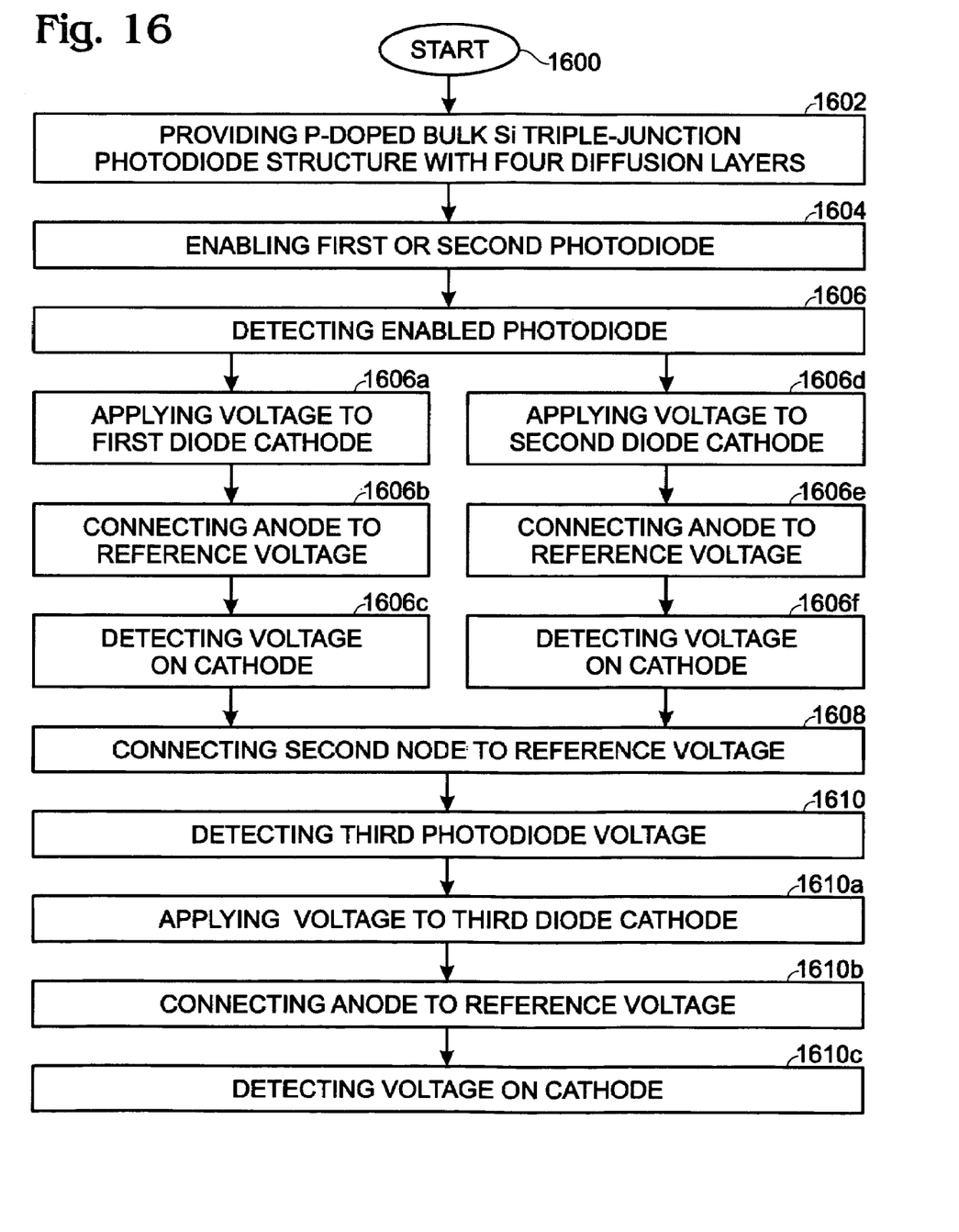
FIG. 16 is a flowchart illustrating a method for independently detecting signals from a triple junction CMOS color imager cell with four diffusion layers.

FIG. 16 is a flowchart illustrating a method for independently detecting signals from a triple-junction CMOS color imager cell with four diffusion layers. The method starts at Step 1600. Step 1602 provides a p-doped bulk silicon (Si) substrate with a triple-junction structure with first, second, and third photodiodes, where the first and second photodiodes share a first common node, and the second and third photodiodes share a second common node overlying the p-doped Si substrate. Step 1604 enables either a first or second photodiode voltage. Step 1606 detects the enabled photodiode voltage at the first common node. Step 1608 connects the second common node to reference voltage. Step 1610 detects the third photodiode voltage. They method steps are associated with the circuits of FIG. 7 and FIG. 11.

In some aspects, Step 1602 provides a triple-junction structure where the first and second photodiodes share a common cathode, and second and third photodiodes share a common anode. Then, Step 1606 detects the voltage on the cathodes of the first and second photodiodes, and Step 1608 connects the anodes of the second and third photodiodes to the reference voltage.

In another aspect, detecting the first photodiode voltage in Step 1606 includes substeps. Step 1606a applies a voltage to the first photodiode cathode. Step 1606b connects the first photodiode anode to the reference voltage, and Step 1606c detects the voltage on the first photodiode cathode. Likewise, detecting the second photodiode voltage in Step 1606 includes alternate substeps. Step 1606d applies a voltage to the second photodiode cathode. Step 1606e connects the second photodiode anode to the reference voltage, and Step 1606f detects the voltage on the second photodiode cathode. Detecting the third photodiode voltage includes the following substeps. Step 1610a applies a voltage to the third photodiode cathode. Step 1610b connects the third photodiode anode to the reference voltage, and Step 1610c detects the voltage on the third photodiode cathode.

Figure 17:
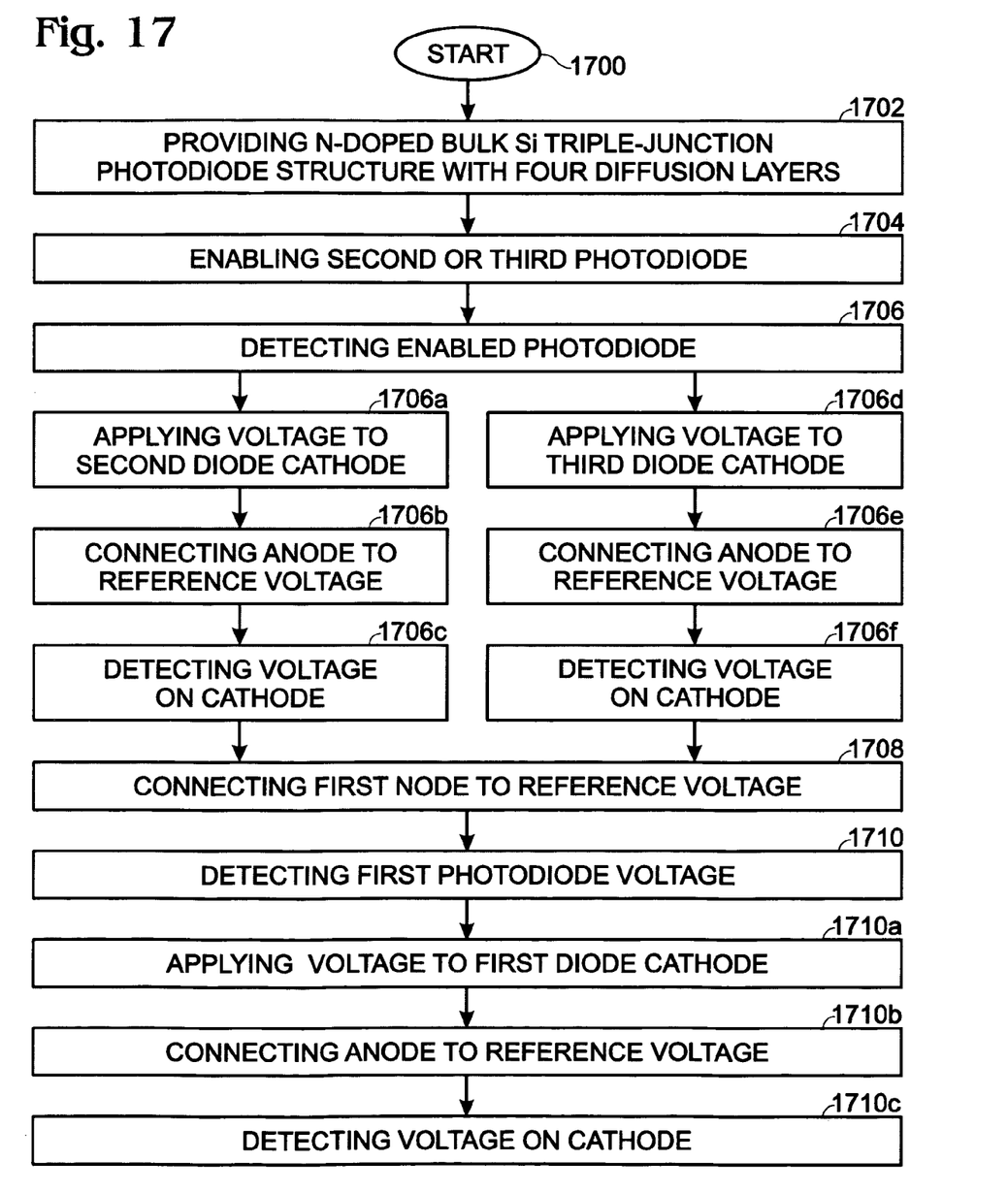
FIG. 17 is a flowchart illustrating another method for independently detecting signals from a triple-junction CMOS color imager cell with four diffusion layers.

FIG. 17 is a flowchart illustrating another method for independently detecting signals from a triple-junction CMOS color imager cell with four diffusion layers. The method starts at Step 1700. Step 1702 provides an n-doped bulk silicon (Si) substrate with a triple-junction structure of first, second, and third photodiodes, where the first and second photodiodes share a first common node, and the second and third photodiodes share a second common node overlying the n-doped Si substrate. Step 1704 enables either a second or third photodiode voltage. Step 1706 detects the enabled photodiode voltage at the second common node. Step 1708 connects the first common node to reference voltage, and Step 1710 detects the first photodiode voltage. This method is associated with the circuits of FIG. 8 and FIG. 12.

In one aspect, Step 1702 provides a triple-junction structure with first and second photodiodes sharing a common anode, and second and third photodiodes sharing a common cathode. Then, detecting the enabled photodiode voltage in Step 1706 includes detecting the voltage on the cathodes of the second and third photodiodes, and Step 1708 connects the anodes of the first and second photodiodes to the reference voltage.

In another aspect, detecting the first photodiode voltage in Step 1710 includes substeps. Step 1710a applies a voltage to the first photodiode cathode. Step 1710b connects the first photodiode anode to the reference voltage, and Step 1710c detects the voltage on the first photodiode cathode. Detecting the second photodiode voltage includes the following substeps. Step 1706a applies a voltage to the second photodiode cathode. Step 1706b connects the second photodiode anode to the reference voltage, and Step 1706c detects the voltage on the second photodiode cathode. Alternately, detecting the third photodiode voltage includes the following substeps. Step 1706d applies a voltage to the third photodiode cathode. Step 1706e connects the third photodiode anode to the reference voltage, and Step 1706f detects the voltage on the third photodiode cathode.

Some triple-junction CMOS imager cell variations have been provided, fabricated in a bulk Si substrate, with associated transistor sets that permit the three photodiode voltages to be read independent of each other. However, the invention is not limited to merely these examples. It will be appreciated that further variations and modifications thereof may be made within the scope of the invention as defined in the appended claims.

We claim:

1. A triple-junction complementary metal-oxide semiconductor (CMOS) filterless color imager cell, the imager cell comprising:
    a bulk n-doped silicon (Si) substrate;
    a photodiode set including a first, second, and third photodiode formed as a triple-junction structure in the Si substrate and including four diffusion layers as follows
        the first photodiode forming a pn junction from a first n+-doped region at the Si substrate top surface, to an underlying p-doped region;
        the second photodiode forming a pn junction from the p-doped region to an underlying second n-doped region;
        the third photodiode forming a pn junction from the second n-doped region to the underlying p-doped well (p-well), which overlies the n-doped Si substrate; and,
    a transistor set connected to the photodiode set, and detecting an independent output signal for each photodiode.

2. The imager cell of claim 1 wherein the transistor set detects an output signal for the first photodiode, but not the second and third photodiodes, at a first time;
    wherein the transistor set detects an output signal for the second photodiode, but not the first and third photodiodes, at a second time, different than the first time; and,
    wherein the transistor set detects an output signal for the third photodiode, but not the first and second photodiodes, at a third time, different than the first and second times.

3. The imager cell of claim 1 wherein the transistor set is an 8T cell including:

a first (NMOS) transistor (T1) with a first source/drain (S/D) region, a second S/D region connected to the first n+-doped region, and a gate connected to a first select line (V1);
    a second (NMOS) transistor (T2) with a first S/D region connected to the p-doped region, a second S/D region connected to the n-doped Si substrate, and a gate connected to a second select line (V2);
    a third (NMOS) transistor (T3) with a first S/D region, a second S/D region connected to the n-doped Si substrate, and a gate connected to a third select line (V3);
    a fourth (PMOS) transistor (T4) with a first S/D region connected to the second n-doped region, a second S/D region connected to the T1 first S/D region, and a gate connected to the first select line (V1);
    a fifth (NMOS) transistor (T5) with a first S/D region connected to a supply voltage (Vdd), a second S/D region connected to the T1 first S/D region, and a gate connected to a reset line;
    a sixth (NMOS) transistor (T6) with a first S/D region connected to the p-doped region, a second S/D region connected to the n-doped Si substrate, and a gate connected to the first select line (V1);
    a seventh (NMOS) transistor (T7) with a first S/D region connected to the supply voltage, a second S/D region, and a gate connected to the T1 first S/D region; and,
    an eighth (NMOS) transistor (T8) with a first S/D region connected to the T7 second S/D region, a second S/D region connected to supply a photodiode output signal selected from a group consisting of the first, second, and third photodiodes, and a gate connected to a row select input.

4. The imager cell of claim 1 wherein the first photodiode pn junction has a depth of about 0.1 to 0.4 micrometers beneath the Si substrate top surface;
    wherein the second photodiode pn junction has a depth about 0.4 to 0.6 µm beneath the Si substrate top surface;
    wherein the third photodiode pn junction has a depth about 1.8 to 2.2 µm beneath the Si substrate top surface; and,
    wherein the interface between the p-well and the underlying n-doped substrate is about 3.5 to 6 µm beneath the Si substrate top surface.

5. A triple-junction complementary metal-oxide semiconductor (CMOS) filterless color imager cell, the imager cell comprising:
    a bulk n-doped silicon (Si) substrate;
    a photodiode set including a first, second, and third photodiode formed as a triple-junction structure in the Si substrate including:
        the first photodiode forming a pn junction from an p-doped (p+) region at the Si substrate top surface, to an underlying n-doped region;
        the second photodiode forming a pn junction to the n-doped region from an underlying p-well;
        the third photodiode forming a pn junction from the p-well to the underlying n-doped Si substrate; and,
    a transistor set connected to the photodiode set, and detecting an independent output signal for each photodiode.

6. A triple-junction complementary metal-oxide semiconductor (CMOS) filterless color imager cell, the imager cell comprising:
    a bulk p-doped silicon (Si) substrate;
    a photodiode set including a first, second, and third photodiode formed as a triple-junction structure in the Si substrate including:

the first photodiode forming a pn junction from an n+-doped region at the Si substrate top surface, to an underlying p-doped region;

the second photodiode forming a pn junction from the p-doped region to an underlying n-well;

the third photodiode forming a pn junction from the n-well to the underlying p-doped Si substrate; and, an 11T (transistor) set connected to the photodiode set, and detecting an independent output signal for each photodiode, the 11T set including:

a first (NMOS) transistor (T1) with a first source/drain (S/D) region, a second S/D region connected to the p-doped region, and a gate connected to a first select line (V1);

a second (NMOS) transistor (T2) with a first S/D region connected to the p-doped region, a second S/D region, and a gate connected to a second select line (V2);

a third (NMOS) transistor (T3) with a first S/D region, a second S/D region connected to the n-well, and a gate connected to a third select line (V3);

a fourth (NMOS) transistor (T4) with a first S/D region connected to the T2 second S/D region, a second S/D region connected to the p-doped Si substrate, and a gate connected to a reset line;

a fifth (NMOS) transistor (T5) with a first S/D region connected to a supply voltage (Vdd), a second S/D region connected to the T3 first S/D, and a gate connected to the reset line;

a sixth (PMOS) transistor (T6) with a first S/D region connected to the n-well, a second S/D region, and a gate connected to the third select line (V3);

a seventh (NMOS) transistor (T7) with a first S/D region connected to the T6 second S/D region, a second S/D region connected to the p-doped Si substrate, and a gate connected to the second select line (V2);

an eighth (NMOS) transistor (T8) with a first S/D region connected to the supply voltage (Vdd), a second S/D region connected to the n+-doped region, and a gate connected to the reset line;

a ninth (NMOS) transistor (T9) with a first S/D region connected to the supply voltage (Vdd), and second S/D region to supply the first photodiode output signal, and a gate connected to n-doped region;

a tenth (PMOS) transistor (T10) with a first S/D region connected to supply the second photodiode output signal, a second S/D region connected to the p-doped Si substrate, and a gate connected to the second S/D region of T2; and, an eleventh (NMOS) transistor (T11) with a first S/D region connected to the supply voltage (Vdd), a second S/D region to supply the third photodiode output signal, and a gate connected to the T3 first S/D region.

7. A triple-junction complementary metal-oxide semiconductor (CMOS) filterless color imager cell, the imager cell comprising:

a bulk p-doped silicon (Si) substrate;

a photodiode set including a first, second, and third photodiode formed as a triple-junction structure in the Si substrate and including four diffusion layers as follows:

the first photodiode forming a pn junction from a first p+-doped region at the Si substrate top surface, to an underlying n-doped region;

the second photodiode forming a pn junction from the n-doped region to an underlying second p-doped region;

the third photodiode forming a pn junction from the second p-doped region to the underlying n-doped well (n-well), which overlies the p-doped Si substrate; and, an 8T (transistor) set connected to the photodiode set, and detecting an independent output signal for each photodiode, the 8T set including:

a first (NMOS) transistor (T1) with a first source/drain (S/D) region connected to the first p+-doped region, a second S/D region connected to the p-doped Si substrate, and a gate connected to a first select line (V1);

a second (NMOS) transistor (T2) with a first S/D region connected to the second p-doped region, a second S/D region connected to the p-doped Si substrate, and a gate connected to a second select line (V2);

a third (NMOS) transistor (T3) with a first S/D region, a second S/D region connected to the n-well, and a gate connected to a third select line (V3);

a fourth (PMOS) transistor (T4) with a first S/D region connected to the n-doped region, a second S/D region connected to the T3 first S/D region, and a gate connected to the third select line (V3);

a fifth (NMOS) transistor (T5) with a first S/D region connected to a supply voltage (Vdd), a second S/D region connected to the T3 first S/D region, and a gate connected to a reset line;

a sixth (NMOS) transistor (T6) with a first S/D region connected to the second p-doped region, a second S/D region connected to the p-doped Si substrate, and a gate connected to the third select line (V3);

a seventh (NMOS) transistor (T7) with a first S/D region connected to the supply voltage, a second S/D region, and a gate connected to the T3 first S/D region; and, an eighth (NMOS) transistor (T8) with a first S/D region connected to the T7 second S/D region, a second S/D region connected to supply a photodiode output signal selected from a group consisting of the first, second, and third photodiodes, and a gate connected to a row select input.

* * * * *